United States Patent
Goodwin et al.

(10) Patent No.: US 9,301,415 B2
(45) Date of Patent: Mar. 29, 2016

(54) PLUG STANDARDS-COMPLIANT CIRCUIT MODULES AND CONNECTORS

(71) Applicant: Avant Technology, Inc., Pflugerville, TX (US)

(72) Inventors: Paul Goodwin, The Hills, TX (US); Tim Peddecord, Austin, TX (US)

(73) Assignee: AVANT TECHNOLOGY, INC., Pflugerville, TX (US)

( * ) Notice: Subject to any disclaimer, the term of this patent is extended or adjusted under 35 U.S.C. 154(b) by 0 days.

(21) Appl. No.: 14/626,515

(22) Filed: Feb. 19, 2015

(65) Prior Publication Data
US 2015/0163944 A1 Jun. 11, 2015

Related U.S. Application Data

(63) Continuation-in-part of application No. 14/612,046, filed on Feb. 2, 2015, which is a continuation-in-part of application No. 14/053,028, filed on Oct. 14, 2013, now Pat. No. 8,951,070.

(51) Int. Cl.
| | |
|---|---|
| H05K 1/11 | (2006.01) |
| H05K 7/10 | (2006.01) |
| G06F 1/18 | (2006.01) |
| H01R 12/72 | (2011.01) |
| H05K 1/02 | (2006.01) |
| H05K 3/00 | (2006.01) |
| H01R 12/70 | (2011.01) |

(52) U.S. Cl.
CPC .............. *H05K 7/1053* (2013.01); *G06F 1/186* (2013.01); *H01R 12/721* (2013.01); *H05K 1/0284* (2013.01); *H05K 1/0296* (2013.01); *H05K 1/111* (2013.01); *H05K 3/0017* (2013.01); *H01R 12/7082* (2013.01); *H05K 2201/09081* (2013.01); *H05K 2201/10189* (2013.01)

(58) Field of Classification Search
USPC ........................ 361/785, 679.3, 756; 174/261
See application file for complete search history.

(56) References Cited

U.S. PATENT DOCUMENTS

| | | | |
|---|---|---|---|
| 5,126,890 | A | 6/1992 | Wade et al. |
| 5,933,322 | A | 8/1999 | Ruch et al. |
| D423,473 | S | 4/2000 | Iwamoto |
| D443,247 | S | 6/2001 | Chuan et al. |
| D452,496 | S | 12/2001 | Murnaghan et al. |
| D653,666 | S | 2/2012 | Zhou |
| D679,713 | S | 4/2013 | McParland et al. |
| D691,608 | S | 10/2013 | Samuels et al. |
| D691,609 | S | 10/2013 | Woodman et al. |

(Continued)

OTHER PUBLICATIONS

Serial ATA International Organization: Serial ATA Revision 3.0, Jun. 2, 2009, Gold Revision.

(Continued)

*Primary Examiner* — Andargie M Aychillhum
(74) *Attorney, Agent, or Firm* — D. Scott Hemingway; Hemingway & Hansen, LLP

(57) ABSTRACT

A circuit module configured for connective mating with standards compliant receptacles includes a PCB configured with one or more tabs populated with conductive pads for connection to the receptacle. In preferred embodiments, the tab or tabs emerge from a circuit module case configured to be substantially compliant with dimensional requirements for connectors that couple with receptacles compliant with various specifications including, in preferred embodiments, the SFF 8639 or SATA Specifications.

31 Claims, 14 Drawing Sheets

(56) References Cited

U.S. PATENT DOCUMENTS

| | | |
|---|---|---|
| 8,951,070 B1 | 2/2015 | Goodwin |
| D727,908 S | 4/2015 | Samuels et al. |
| D727,909 S | 4/2015 | Woodman et al. |
| 2003/0193316 A1 | 10/2003 | Guo et al. |
| 2009/0130878 A1 | 5/2009 | Xu et al. |
| 2010/0099307 A1 | 4/2010 | Zhang et al. |
| 2011/0263162 A1 | 10/2011 | Zhu |
| 2012/0077385 A1 | 3/2012 | Qiao |
| 2012/0108109 A1 | 5/2012 | Zhang et al. |
| 2014/0106590 A1 | 4/2014 | Wu et al. |
| 2014/0213101 A1* | 7/2014 | Gomez et al. ............ 439/505 |
| 2014/0335732 A1* | 11/2014 | Oberski et al. ............ 439/626 |
| 2015/0144383 A1 | 5/2015 | Goodwin |
| 2015/0163944 A1 | 6/2015 | Goodwin et al. |

OTHER PUBLICATIONS

SFF Committee, SFF-8680 Specification for Serial Attachment 12 GB/s 2X Unshielded Connector, Rev. 1.5, Jun. 15, 2012.

Serial ATA, Oct. 5, 2015 (last modified).

Samsung—SSD White Paper/Samsung SSD: Your Computing Life Upgraded with Samsung V-Nand SSD, 1995-2015 (Copyright).

* cited by examiner

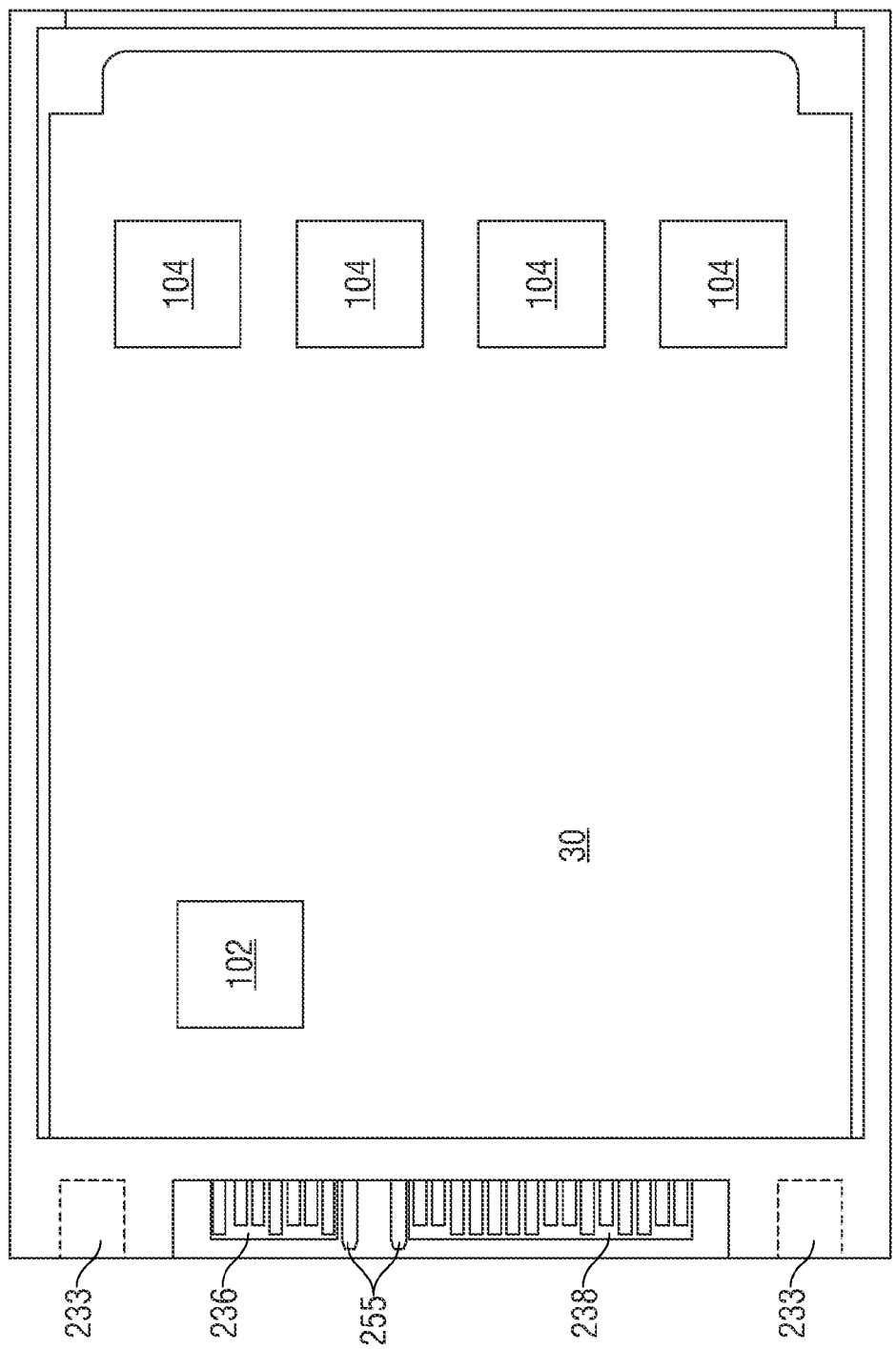

PLUG STANDARDS-COMPLIANT CIRCUIT MODULES AND CONNECTORS

The present application is a continuation-in-part of U.S. patent application Ser. No. 14/612,046, filed Feb. 2, 2015, which is a continuation-in-part of U.S. patent application Ser. No. 14/053,028, filed Oct. 14, 2013, now U.S. Pat. No. 8,951,070 issued Feb. 10, 2015. U.S. patent application Ser. No. 14/612,046 and U.S. Pat. No. 8,951,070 are hereby incorporated by reference.

TECHNICAL FIELD

Background of the Invention

The present invention relates to circuit modules and electrical connectors and, more particularly, to improved standards-compliant connectors and circuit modules.

Electrical connectors are employed by almost all electrical or electronic systems. Designers of electronic components ranging from portable consumer electronics to massive computer platforms have constantly strived to find the highest performing, lowest cost connectors and strategies for connecting such components. The applications may vary, from plugging modules into a back plane to plugging a set of headphones into a portable media player, but the goal is the same, to provide the best performing connection at the lowest cost.

Recent trends in the industry have tended to reduce the number of interconnect pins on integrated circuits employed in electronic systems. One method of reducing the number of pins is to replace parallel signal interfaces with high speed serial channels that transfer data with equal or greater bandwidth using fewer signals pins. However, to achieve the same bandwidth as a parallel interface, the signals on a serial interface must run at faster speed. For example, when a 16-bit parallel interface consisting of 16 individual data channels, is replaced by a single serial channel, the serial channel will have to operate at 16× the speed of one of the parallel channels.

Consequently, to achieve the speeds required, the serial lines may have to employ differential signaling techniques. Differential signaling techniques allow signals to run at significantly higher speeds than do single-ended techniques. This results in an overall reduction of the number of connections required to provide the bandwidth necessary for the interface.

The adoption of high-speed serial interconnects has resulted in significant increases in interface speeds that are now pushing toward 24 Gigabits per second (Gb/s). The increase in data rates has, however, introduced a new set of problems many of which relate to signal integrity.

One of the most important factors in the design of a system interconnect is what is known as signal integrity. Signal integrity refers to the quality of the signal at the receiving end of the network and, therefore, it determines the maximum speed at which the channel can transfer data. Example factors that affect the signal integrity of an interconnect are: component variation, material variations, power distribution, signal crosstalk, PCB layout, PCB construction and impedance discontinuities. Most of these factors can be addressed with good design and manufacturing techniques for given components or materials. However, the ubiquity of signal connectors has made impedance discontinuities an issue that has received considerable industry attention.

A common impedance discontinuity arises when the cross-sectional profile of a conducting element changes. As those of skill will appreciate, when a conducting element presents two cross sections, the first cross-section of the conducting element has a first characteristic impedance while the second cross-section of the conducting element has a second and typically different characteristic impedance. This creates two physically dissimilar transmission lines and causes distortion in the fields and signals conveyed.

Another impedance discontinuity arises where connectors do not have a "through" characteristic impedance that matches the transmission line. Not only may there be geometric discontinuities, the length of the different sections with different characteristic impedances may create significant signal reflection which has an adverse effect upon signal integrity. A substantial portion of impedance related issues are an artifact of transmission line topology. As transmission lines transit through different planes and geometries, multiple opportunities for impedance mismatching arise. As those of skill will recognize, a section of mismatched line in an otherwise matched system changes the impedance looking into the mismatched section.

From an impedance perspective, connectors are complex. Their individual components and geometries can each contribute to make uncertain what might be thought an easily determined impedance value. The leading edge of a signal propagating down the transmission line model of a connector acts like a wave. When a wave hits an impedance discontinuity, a portion of the wave is going to continue propagating while a portion is reflected back toward the source. The percentage of the wave reflected is related to the difference in characteristic impedance of two (2) segments. The greater the discontinuity, the greater the reflection. In short, impedance deviations cause signal reflections and impair transmission characteristics. Contemporary connectors present, however, too many opportunities for impedance mismatching. Consequently, what is needed is a new connector design and strategy compliant with existing standards but which presents a cleaner impedance path to signal flow while potentially reducing costs in circuit modules of a variety of types and functions.

SUMMARY OF THE INVENTION

A circuit module configured for connective mating with standards compliant receptacles includes a PCB configured with one or more tabs populated with conductive pads for connection to the receptacle. In preferred embodiments, the tab or tabs emerge from a circuit module case configured to be substantially compliant with dimensional requirements for connectors that couple with receptacles compliant with various specifications including, in preferred embodiments, the SFF 8639 or SATA Specifications. Constituent conductive pads of the tab or tabs are substantially coplanar with etch traces of the PCB to which they are connected. Discontinuities that contribute to impedance discontinuity are minimized by the configurations disclosed for exemplar circuit modules and connective facilities which may be employed in circuit modules of a variety of types and functions. In a preferred embodiment that implements the PCIe protocol specification, a circuit module presents a tab at a connector-replacing end of the PCB that supports electrical contacts disposed on the tab first and second sides as well as a key adjunct which together meet the dimensional requirements for the blade of the SFF 8639 specification. In some preferred circuit module embodiments, a case includes housing features configured for attachment with industry standard receptacles.

BRIEF DESCRIPTION OF THE DRAWINGS

FIG. 21 depicts a perspective view of a lower portion of a case configured for mechanical mating with a SATA standards compliant receptacle and within which case a circuitry populated PCB is disposed and from which case emerge two tabs from two respective slots.

DETAILED DESCRIPTION OF PREFERRED EMBODIMENT

Figure 1A:
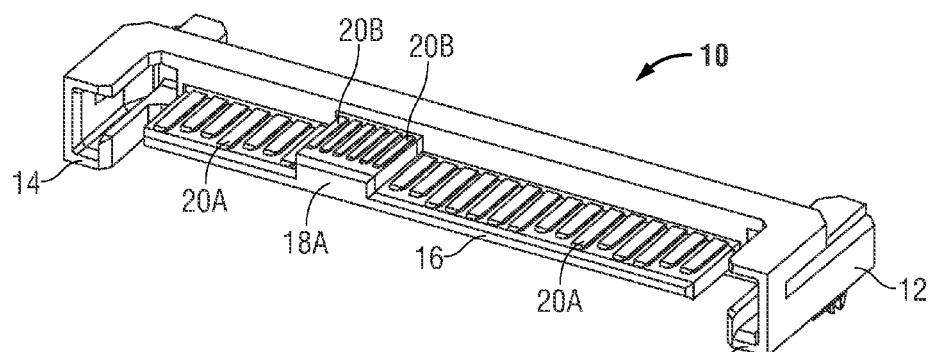
FIGS. 1A and 1B depict lower and upper aspect views, respectively, of a conventional SFF 8639 specification compliant plug connector.
Figure 1B:
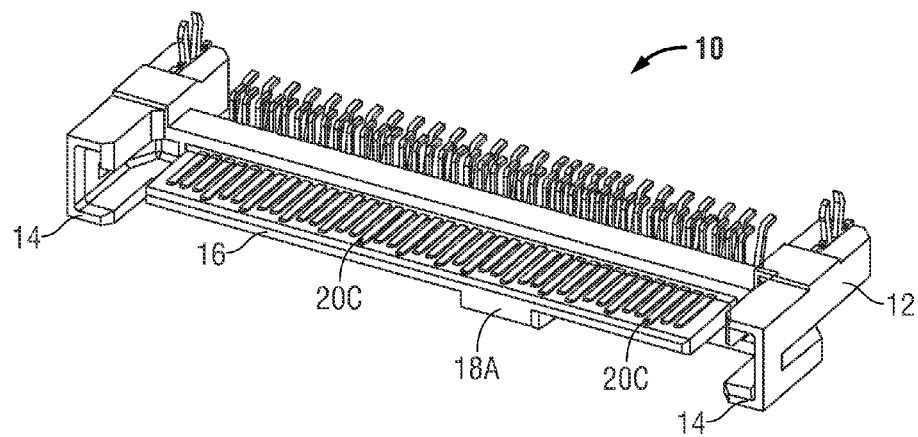

FIGS. 1A and 1B depict lower and upper aspect views, respectively, of a conventional SFF 8639 specification compliant plug connector 10. As shown in FIG. 1A, conventional plug connector 10 is comprised of a connector housing 12 that exhibits features that conform to the industry standard SFF 8639 Specification. Blade 16 spans much of the distance between the guide posts 14 that align conventional compliant plug connector 10 with a SFF 8639 specification compliant receptacle connector and facilitate blind mating. The dimensions of width and thickness of blade 16 are specified in the SFF 8639 Specification Version 1.9 dated Mar. 31, 2014 which is incorporated by reference herein and shall be referred to as the SFF-8639 specification. Blade 16 shall be understood in the text of this disclosure to be the "8639 blade 16." As shown in FIG. 1A, 8639 blade 16 is shown with its "key" 18A. Key 18A is a raised area that supports a set of contacts specified in the SFF 8639 Specification.

FIG. 1B is an aspect view of connector 10 from "above" and illustrates contacts 20C which are seen from this view from "above" as typically understood by those of skill in the art. FIG. 1A is typically understood as the view from "below" or the "bottom" of plug connector 10 and shows contacts 20A along 8639 blade 16 and contacts 20B supported by key 18A.

Figure 1C:
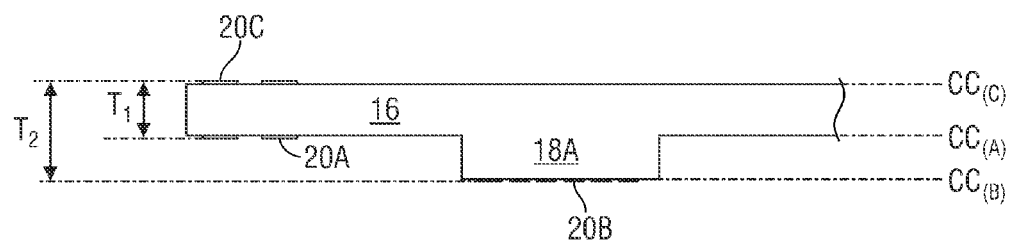
FIG. 1C depicts a cross-sectional view of a blade of an SFF 8639 specification compliant connector.

FIG. 1C is a cross sectional profile view of blade 16 showing two thicknesses T1 and T2 with T1 being the thickness of the 8639 blade specified between contacts 20A and 20C in the SFF 8639 specification and T2 being the thickness specified for key 18A in the SFF 8639 Specification. Plane $CC_C$ which supports contacts 20C and plane $CC_A$ which supports contacts 20A are further depicted in FIG. 2.

Figure 2:
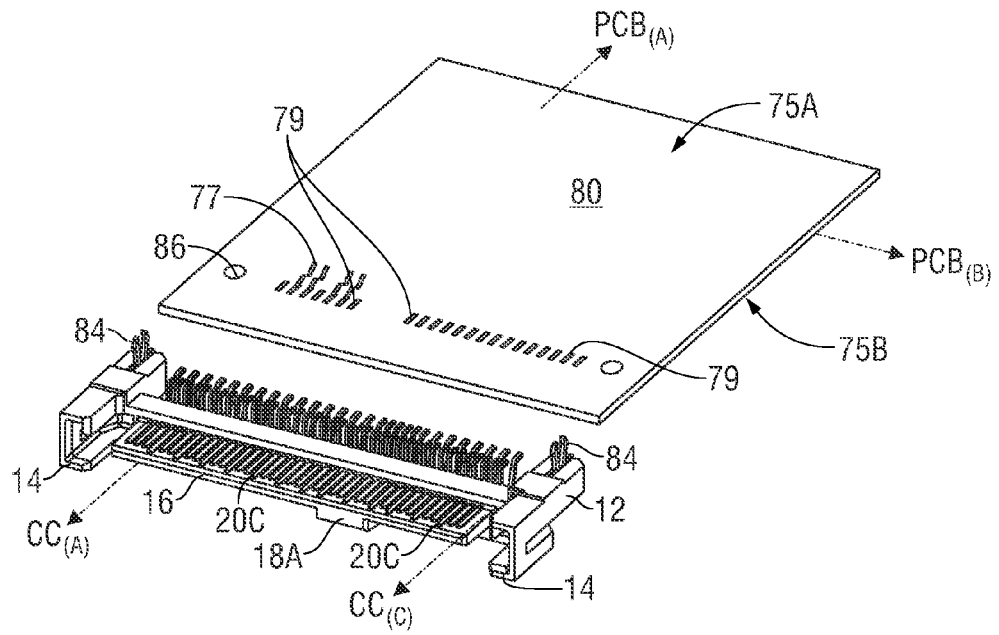
FIG. 2 depicts an exploded view of a conventional circuit module formed from the attachment of a SFF 8639 specification compliant connector with a PCB circuit board.

FIG. 2 depicts an exploded view of a circuit module formed from the attachment of a SFF 8639 specification compliant connector 10 with a PCB circuit board 80. As shown, PCB 80 exhibits major sides 75A and side 75B. Side 75A establishes plane $PCB_A$ and side 75B establishes plane $PCB_B$ which planes are shown in later FIG. 8. Clips 84 are used to attach connector 10 to PCB 80 through attachment holes 86. Surface mount pads 79 provide connection sites for electrical connection of signals conveyed on etch traces 77 of PCB 80 to connector 10 as shown in greater detail in FIG. 8. Plane $CC_C$ of blade 16 supports contacts 20C and plane $CC_A$ of blade 16 supports contacts 20A which are not visible in this view. As those of skill will understand after appreciating this disclosure, the planes of the surfaces of blade 16 are not coplanar with the planes of PCB 80 when connector 10 and PCB 80 are connected. For example, $PCB_B$ and $CC_A$ are not coplanar and differ in co-planarity by more than the thickness T1 of blade 16 just as $PCB_A$ and $CC_B$ are not coplanar and differ in co-planarity by more than the thickness T1 of blade 16 as shown in more detail in later FIG. 8.

Figure 3A:
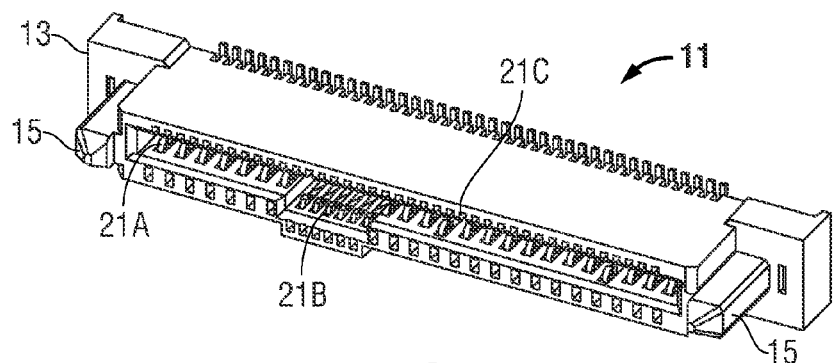
FIGS. 3A and 3B depict a conventional SFF 8639 specification compliant receptacle.
Figure 3B:
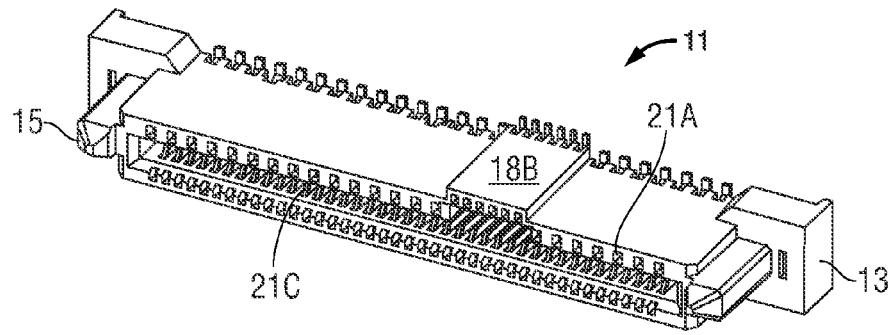

FIGS. 3A and 3B depict a receptacle 11 compliant with the SFF 9639 specification. As shown in FIG. 3A, receptacle 11 exhibits housing 13 and guide posts 15 as well as contacts 21A, 21B, and 21C. As shown in FIG. 3B, receptacle 11 includes key receptacle 18B for receipt of key 18A of plug 10 or a similarly configured key bearing appropriate contacts.

The location and number of contacts 20A, 20B and 20C of plug connector 10 as well as its guide posts 12, connector 8639 blade 16, key 18A and its location are stated in the SFF-8639 specification. For example, the dimensional requirements for a SFF 8639 specification compliant connector such as blade extension, width, thickness as well as key configuration are stated in the SFF-8639 Specification.

Figure 4:
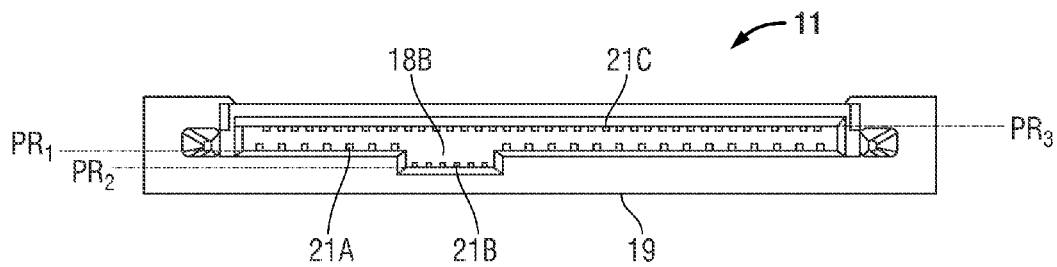
FIG. 4 depicts a "head-on" view of a conventional SFF 8639 specification complaint receptacle.

FIG. 4 depicts a "head-on" view of receptacle 11. Key receptacle 18B is a cavity configured in frame 19 of receptacle 11 for reception of key 18A of plug 10. As shown in FIG. 4, contacts 21B correspond to and make contact with contacts 20B of plug 10 and are supported by plane PR2 of key receptacle 18B. Contacts 21A correspond to contacts 20A of plug 10 and are supported by plane PR1 while contacts 21C correspond to contacts 20C of plug 10 and are supported by plane PR3.

Figure 5A:
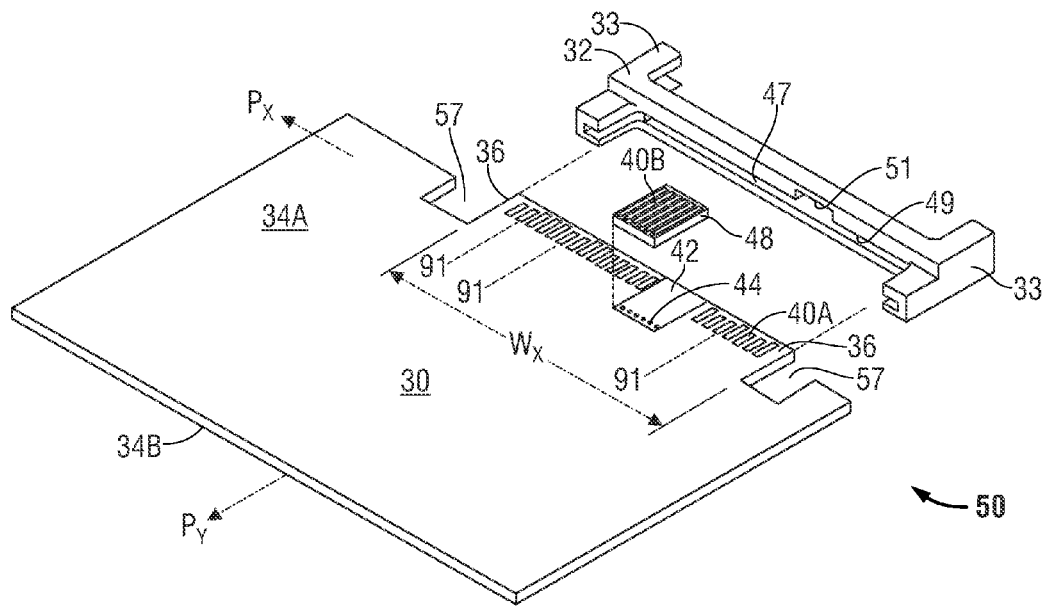
FIG. 5A is an exploded isometric view of features of an embodiment of an exemplar circuit module comprised in accordance with the principles of the present invention.

FIG. 5A is an exploded isometric view of features from which an embodiment of an exemplar module 50 may be comprised in accordance with the principles of the present invention. Printed circuit board 30 or, as it is commonly referred to in the industry, PCB 30, is shown along with connector housing 32 that is integrated with PCB 30 so as to, in the embodiment, provide a circuit module 50 of any of a variety of functions configured for connector compliance with the SFF 8639 Specification or other specification. As those of skill will recognize, the SFF 8639 Specification dictates certain features of connective plugs and receptacles that are employed as adjuncts in implementation of interface standards such as PCIe or SAS particularly when higher data throughput speeds are sought.

PCB 30 has a top first surface 34A that establishes plane $P_X$ and a second bottom surface 34B that establishes plane $P_Y$. There is a tab 36 with width $W_X$ formed on one end of PCB 30. The size, shape, thickness, width and relative position of tab 36 approximates the size, shape, thickness, width and relative position of connector 8639 blade 16 found in a conventional SFF 8639 Specification compliant plug connector such as depicted in FIG. 1 and specified in the SFF 8639 Specification.

In a preferred embodiment, the width of tab 36 ($W_X$) is substantially the same measure as is specified for the width of a 8639 blade as specified in the SFF 8639 Specification. In the SFF 8639 Specification, dimensional requirements for a connector are stated and when reference is herein made to a particular dimension of a conventional SFF 8639 Specification compliant connector, reference is being made to the subject dimension cited in the SFF 8639 Specification.

Being an extended part of PCB 30, tab 36 shares top surface 34A and bottom surface 34B with PCB 30 along with planes $P_X$ and $P_Y$ respectively. Disposed on the first top surface 34A on its extent on tab 36 of PCB 30 are conductive pads 40A which are of a number, length, width and separation that substantially conform to the specification of contacts 20A required for compliance with the SFF 8639 Specification in a conventional SFF 8639 Specification compliant plug connector such as plug connector 10 depicted in FIG. 1. Conductive pads 40A are connected to etch traces 91 which are on PCB 30 at the level of plane PX while there are similar traces in preferred embodiments on surface 34B which connect with conductive pads 40C on that side of tab 36.

Figure 5B:
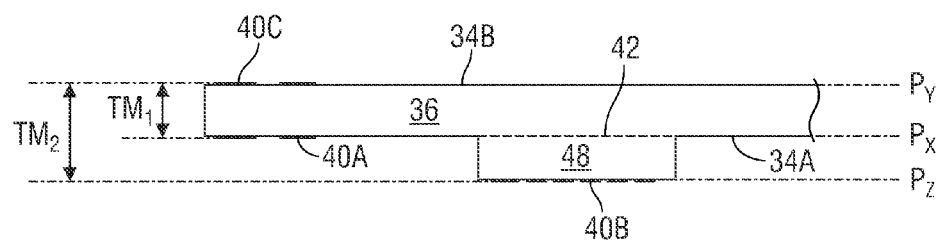
FIG. 5B depicts a cross-sectional view of a part of a PCB tab in an embodiment.

As shown in FIG. 5A, there is an area 42 along tab 36 which is devoid of conductive pads 40A. Area 42 is the locale where key adjunct 48 resides in an embodiment. Key adjunct 48 bears conductive pads 40B and corresponds to the role of key 18A in a conventional SFF 8639 specification compliant plug such as plug 10 and those conductive pads 40B are supported by third plane $P_Z$ for established by key adjunct 48 in compliance with the SFF 8639 specification. Planes $P_X$, $P_Y$, and $P_Z$ are shown in FIG. 5B.

Connector housing 32 is a mechanical component devised to adapt tab 36 of PCB 30 when fitted with key adjunct 48 into a circuit module connection that is connectively compliant with the SFF 8639 Specification and in particular its PCIe requirements and which, therefore, is mateable with an industry standard PCIe SFF 8639 specification compliant receptacle connector such as that shown in FIGS. 3A and 3B. Connector housing 32 conforms to mechanical requirements of a plug connector housing as defined by the SFF 8639 Specification. Housing 32 provides the features of connector plug 10 (as shown in earlier FIG. 1) not built directly on tab 36 of PCB 30. For example, guide arms 33 on housing 32 are such a feature and correspond to guide arms 14 of PCIe plug 10. Module side card guides 53 have slots 55 that integrate with notches 57 in PCB 10 to provide support.

A variety of methods can be used to configure tab 36 on PCB 30 as those of skill will recognize after appreciating this disclosure. Routing, for example, is a well-known method readily useful for such configuration. A variety of cutting methods may also be employed for such operation.

FIG. 5A depicts a slot profile 47 in housing 32 comprising slot 49 and key adjunct slot 51. Tab 36 and its key adjunct 48 are configured to pass through slot profile 47 of housing 32. Slot 49 and key adjunct slot 51 which form slot profile 47 are disposed so that when tab 36 extends through slot 49 of connector housing 32, as key adjunct 48 passes through slot 51, tab 36 including its key adjunct 48 is positioned so that it creates a structure that presents a configuration that meets the dimensional requirements for the 8639 blade 16 of the conventional plug connector 10 as specified in the SFF 8639 Specification. Those of skill will recognize that in connector housing 32 when adapted for compliance with interface standards other than PCIe, the slot profile presented by housing 32 may differ from that shown in FIG. 5 and will, in the cases of SAS compliance, exhibit conductive pads on two planes rather than three as shown in earlier FIG. 2, even though for high speed SAS, housing 32 may still exhibit slots 49 and 51, for example. As further shown in FIG. 5A, contact sites 44 provide connective facility for conveyance of signals from circuitry populated upon PCB 30 to the second set of conductive pads comprised from conductive pads 40B which populate key adjunct 48 as shown.

FIG. 5B is an enlarged cross-sectional view of a part of tab 36 showing key adjunct 48 placed at site 42 and identifying thicknesses $TM_1$ and $TM_2$ which correspond to earlier depicted thicknesses $T_1$ and $T_2$, respectively, of a SFF 8639 specification compliant 8639 blade 16 as shown in FIG. 1C. $TM_1$ is the thickness of a span across tab 36 from surface 34A to 34B which therefore is not inclusive of the thickness added by key adjunct 48. $TM_2$ is the thickness of a span across tab 36 inclusive of key adjunct 48 as shown. It should be noted that the apparent profile depicted for conductive pads 40A, 40B, and 40C is exaggerated in FIGS. 5B and 6B and, in preferred embodiments, such conductive pads will be substantially coincident with planes $P_X$, and $P_Z$ and $P_Y$, respectively.

Figure 6A:
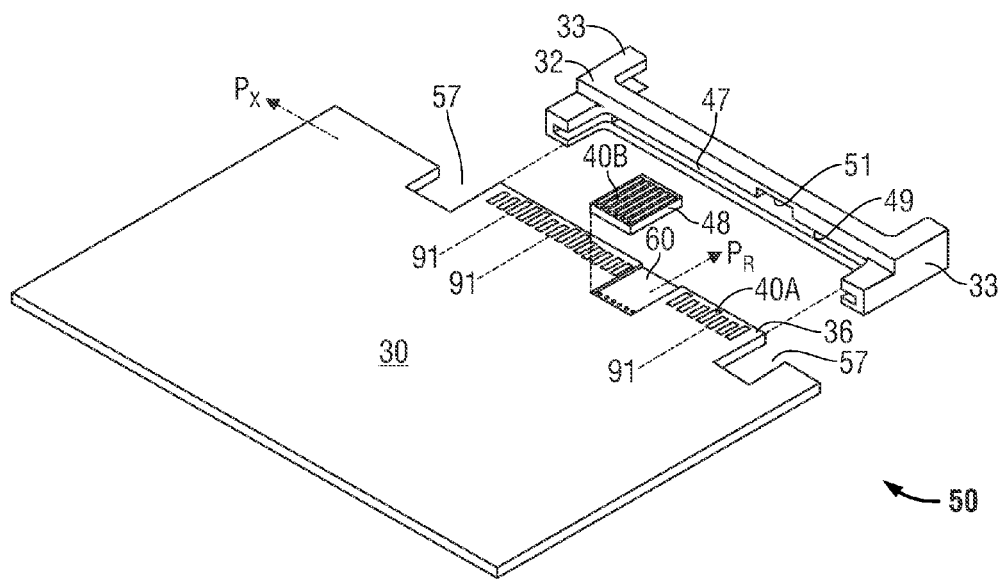
FIG. 6A depicts an exploded view of aspects of an alternative embodiment of an exemplar circuit module in which a key adjunct feature is set into a recessed region on a PCB.

FIG. 6A depicts an exploded view illustrating aspects of an alternative embodiment of an exemplar circuit module 50 in which key adjunct 48 is set into recessed region 60 the floor of which region 60 is at a plane $P_R$ which differs from plane $P_X$ of first surface 34A of PCB 10. Recessed region 60 can be created by a variety of methods such as, for example, routing the recess out after laminating the PCB panel or by routing out a layer of PCB stock prior to lamination. In any case, recessed region 60 aids positioning of key adjunct 48 in an exemplar module 50.

Figure 6B:
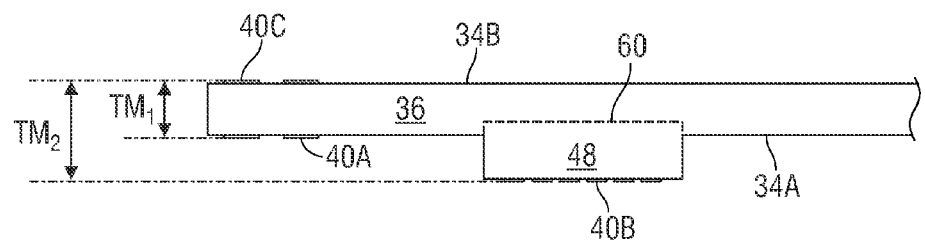
FIG. 6B depicts a cross-sectional view of a part of a PCB tab of the embodiment depicted in FIG. 6A.

FIG. 6B is an enlarged cross-sectional view of a part of tab 36 showing key adjunct 48 placed at recessed site 60 and identifying thicknesses $TM_1$ and $TM_2$ which correspond to earlier depicted thicknesses $T_1$ and $T_2$ respectively a SFF 8639 specification compliant 8639 blade 16 as shown in FIG. 1C.

Figure 7:
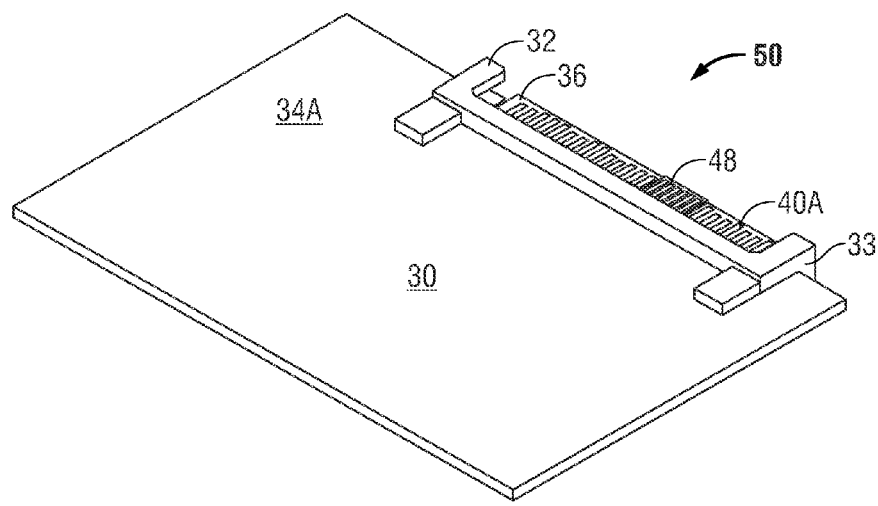
FIG. 7 depicts aspects of an exemplar module with a housing integrated with a PCB in accordance with an embodiment of the present invention.

FIG. 7 depicts aspects of an exemplar module 50 with housing 32 integrated with PCB 30 to present a connector for module 50 that exhibits lower impedance discontinuities, efficiencies in fabrication and can be reasonably expected to exhibit improved reliability outcomes. As those of skill will recognize after appreciating this disclosure, the strategies, connectors and modules presented here eliminate attaching a connector to a PCB. Instead, the electrical part of the connective facility is built into the module. Without having to adapt to a separate connector, modules in accordance with the present invention may be configured with contact areas that more closely align in configuration to the traces on constituent PCBs. Further, smaller solder joints may be used than in cases where separate connectors are added to PCBs populated with circuitry. This is because, in part, the solder joints in a preferred embodiment provide electrical connection but do not have to be relied upon for supplementation mechanical integrity. In addition, cost savings are enhanced with construction efficiencies and higher line throughputs when modules in accordance with the invention are fabricated with housing integration being approximately coincident with or after test in an automated fabrication line.

Figure 8:
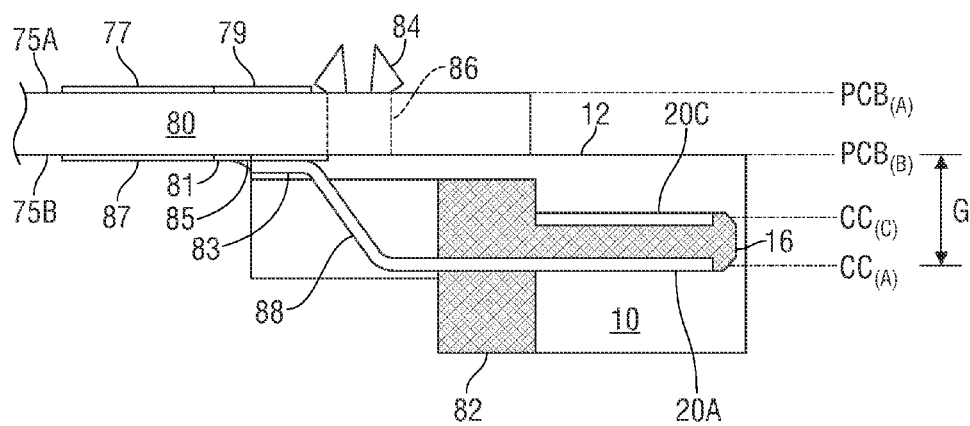
FIG. 8 depicts a cross section of a conventional SFF 8639 specification compliant plug connector mounted on a PCB showing a typical conductive path for contacts of the plug connector.

FIG. 8 depicts a cross section of a conventional plug connector 10 mounted on a PCB 80 showing a typical conductive path for one set of contacts on 8639 blade 16. Shown is connector housing 12 that forms the shroud and supporting member 82 that forms a support structure for contacts 20A of 8639 blade 16. Conventional plug connector 10 is placed on a PCB and is mechanically held in place on PCB 80 with retention clips 84 that are inserted in holes 86 in PCB 80 as earlier shown in FIG. 2. Conventional plug connector 10 typically exhibits contacts 20A, 20B, and 20C but, for clarity of view, in this depiction only selected structures that realize the electrical connection from PCB circuitry to contacts 20A are shown while an exemplar contact 20C is shown. To maintain clarity, however, only part of the connective path between etch trace 77 of PCB 80 and contact 20C is shown. In particular, as to contact 20C, etch trace 77 is shown connected to surface mount pad 79 while the contact structural elements that complete the connection are not shown with regard to contact 20C but as the following disclosure teaches those of skill, the connection of trace 87 to contact 20A provides details that would be analogous for connection of etch trace 77 to contact 20C.

Therefore, the teaching illustration presented in FIG. 8 for contacts 20A should be appreciated as a guide to connective structures employed with contacts 20C while the connective structures for contacts 20B on key 18A present commensurate complexity as those of skill will understand after appreciating this disclosure. One skilled in the art will appreciate that this connector 10 may support a number of contacts 20A, 20B and/or 20C on three respective planes as earlier shown in prior figures and described herein. The exemplary contact structure 88 depicted here is shaped such that when inserted into housing 12 through the supporting member 82, contact 20A is disposed on 8639 blade 16 as well at the other end of contact structure 88, a surface mount lead 83 is provided for electrical connection to surface mount pad 81 on PCB 80 to which it is attached with solder 85.

Recalling the prior discussion concerning impedance discontinuities, the principles of which are well known to those of skill in the art, the electrical path that is created with the standard connector 10 can be followed from trace 87 on PCB 80 to surface mount pad 81 to surface mount trace (SMT) lead 83 (through solder bond 85) to contact structure 88 and through connector housing 12 and support 82 to contact 20A. One skilled in the art will appreciate that there are several points in this electrical path where the signal must transit various topologies and paths presented by the signal circuit pathway and that, consequently, the presented impedance discontinuities are greater and more numerous than desired. In particular, it should be appreciated that in the connection of a conventional connector 10 to a PCB 80 as depicted in FIG. 8, etch traces 87 at the level of $PCB_B$ of PCB 80 are not coplanar with plane $CC_A$ at which level resides contacts 20A to which etch traces 87 are eventually connected by use of conventional connector 10. With reference to earlier FIG. 1C as well as FIG. 8, the non-coplanarity between etch trace 87 and contact 20A is greater than the thickness T1 of 8639 blade 16. Attention is drawn to planar gap G that identifies the non-coplanarity between plane $PCB_B$ of PCB 80 and $CC_A$ of blade 16. As is well understood, this raises impedance discontinuities that impede smooth signal flow and high speeds as do other features of the conventional connection depicted in FIG. 8.

For example, an impedance discontinuity arises where signal trace 87 meets SMT pad 81 on PCB 80. Another impedance discontinuity arises between SMT pad 81 and connector pin 83 as a result of the solder bond 85 as well as the change in geometry between the etched signal trace 87 and connector lead 83. A third impedance discontinuity occurs when contact structure 88 changes in cross-section from a wire 92 to contact 20A configured as a blade as shown in FIG. 9.

The preceding description describes signals that originate on the module of a system that employs a conventional plug connector such as that depicted herein as connector 10. One skilled in the art will recognize that signals originating on the host side of the interconnection will see the same impedance discontinuities in the reverse order.

Figure 9:
FIG. 9 shows a view of a typical pre-formed connector contact structure as may be found in a conventional exemplar SFF 8639 compliant connector plug.

FIG. 9 shows a view of a typical pre-formed connector contact structure 88 as may be found in a conventional connector plug 10. The cross-section change is visible from wire region 92 to blade contact 20A. The change in cross-section is necessary because the width specified for the contact surface of blade 20A of contact structure 88 and the contact to contact spacing does not leave sufficient spacing between the leads at the SMT end to form a reliable solder joint without solder bridging between adjacent contacts.

Figure 10:
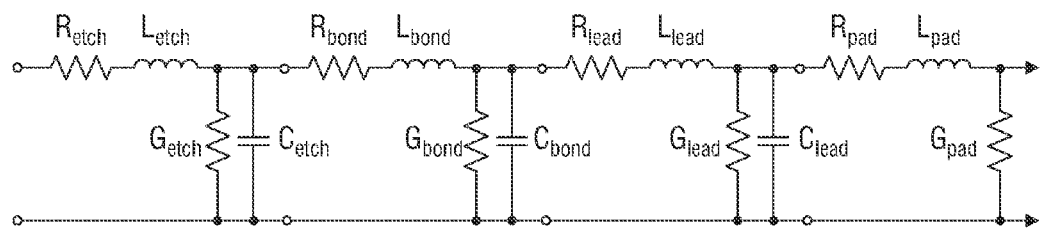
FIG. 10 is a transmission line circuit model diagram for a connective pathway in a conventional SFF 8639 specification compliant connector such as that shown in FIG. 1.

FIG. 10 is a transmission line circuit model diagram for a connective pathway in conventional connector 10 of FIG. 1. Each segment of like properties can be represented by a circuit diagram that is comprised of a series resistance (R), a series inductance (L), a capacitance (C) and a conductance (G). These four (4) properties define the characteristic impedance (Z) of the segment. From the cross-section of FIG. 8 as earlier explained, a path consisting of length of etch trace 87 on PCB 80 leading to a SMT pad 81 with a connector lead 83 electrically and mechanically bonded to the SMT pad 81 with solder 85 leading to a connector lead 88 is present in a conventional SFF 8639 Specification or other standards compliant connector. Thus, the resulting circuit diagram model of FIG. 10 is divided into four segments of similar properties: etch, bond, lead, and pad. The etch signal trace 87 is typically a contiguous piece of copper of a generally uniform size and shape. The bond is actually several elements that are lumped into a single element; the SMT pad 81 is a different size and shape than the etch signal trace 87, while on the SMT pad 81, solder 85 bonds a connector lead 83 of a different geometry and material than etch signal trace 87. Connector lead 88 between solder bond 85 and pad 81 is a generally uniform size and shape leading up to the contact 20A which has a different geometry and is typically plated with gold which further affects the characteristic impedance. As those of skill will appreciate, many impedance discontinuities impede or distort the uniform propagation of signals through a conventional PCIe connector such as example 10.

Figure 11A:
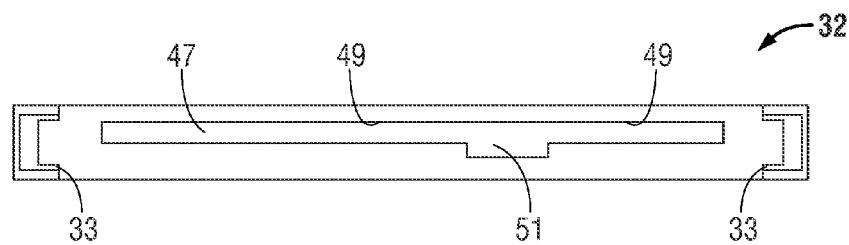
FIGS. 11A, 11B, and 11C depict various mechanical aspects of a connector housing as may be employed in an embodiment of the present invention.
Figure 11B:
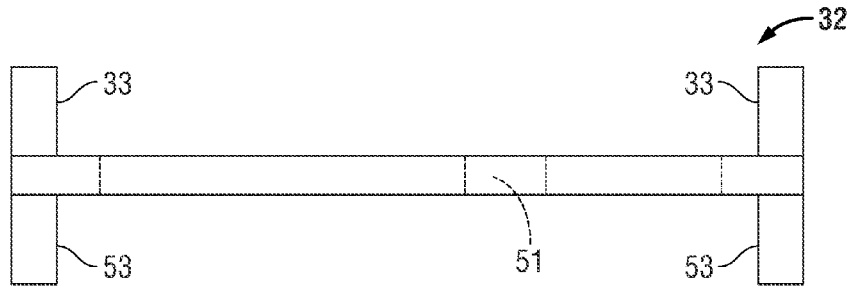
Figure 11C:
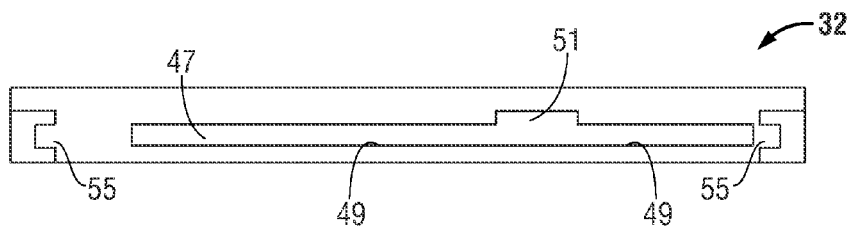

FIGS. 11A, 11B, and 11C depict various mechanical aspects of connector housing 32 as may be employed in an embodiment of the present invention. In FIG. 11A, connector housing 32 is viewed from the front end that plugs into a SFF 8639 Specification receptacle connector such as that shown earlier as receptacle 11. On either side of connector housing 32, there are guide posts 33 that align module 50 with receptacle connector 11 which thus enables blind mating. Slot profile 47 comprised of key adjunct space 51 and slot 49 is shown as the space through which tab 36 and its key adjunct 48 which bears contacts 40B emerge in an assembled module 50. Therefore, tab 36 of PCB 30 bearing earlier shown contacts 40A emerges from slot 49 and key adjunct slot 51 of housing 32.

FIG. 11B shows a top down view of connector housing 32. Guide posts 33 extend from connector housing 32 to mate with the receptacle connector. The dashed lines indicate the location of slot 49 through which tab 36 of PCB 30 emerges with the location of key adjunct space 51 being further delineated by dotted lines as shown. Other elements shown in this view are the guides 53 that align housing 32 with PCB 30.

FIG. 11C shows again some of the features identified in earlier FIGS. 11A and 11B in this view of the PCB side of connector housing 32. FIG. 11C further illustrates PCB guides 53 on either side of connector housing 32 with guide slots 55 that fit over the edges of PCB 30.

Figure 12:
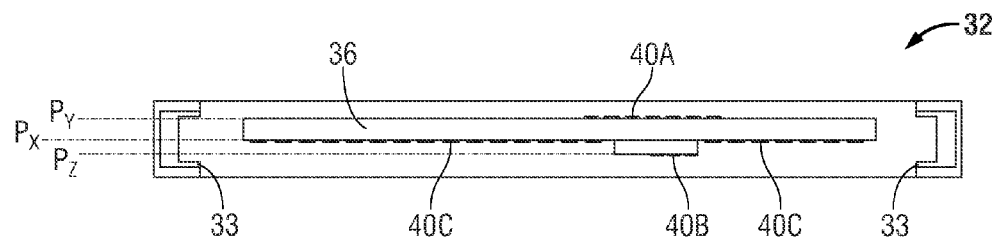
FIG. 12 depicts an end-on view of an exemplar circuit module in accordance with an embodiment of the present invention taken from the perspective of a SFF 8639 specification compliant receptacle such as that shown in FIGS. 3A, 3B and 4.

FIG. 12 depicts an end-on view of an exemplar module 50 from the perspective of a receptacle such as that shown in FIGS. 3A, 3B and 4. As shown in FIG. 12, housing 32 guide posts 33 provide blind mating with the receptacle. Tab 36 of PCB 30 emerges from slot profile 47 which was earlier shown in FIG. 11A and, as tab 36 emerges, conductive pads 40A along plane $P_X$ of tab 36, conductive pads 40B of plane $P_Y$ of tab 36 and conductive pads 40C of plane $P_Z$ of key adjunct 48 are available for connective mating with a PCIe SFF 8639 Specification receptacle or other standards compliant receptacle dependent upon the contact configurations.

Comparing module 50 as opposed to the conventional SFF 8639 Specification plug connector 10, module 50 does not require the additional contact structures of a conventional plug 10 as shown in FIGS. 1A and 1B with its multiple geometries and discontinuities. Module 50 thus has a simplified circuit model diagram and, therefore, a lower impedance with fewer reflections.

Figure 13:
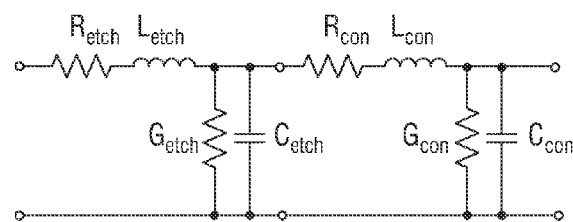
FIG. 13 depicts a circuit diagram model of a connective path in a circuit module devised in accordance with an embodiment of the present invention.
Figure 14:
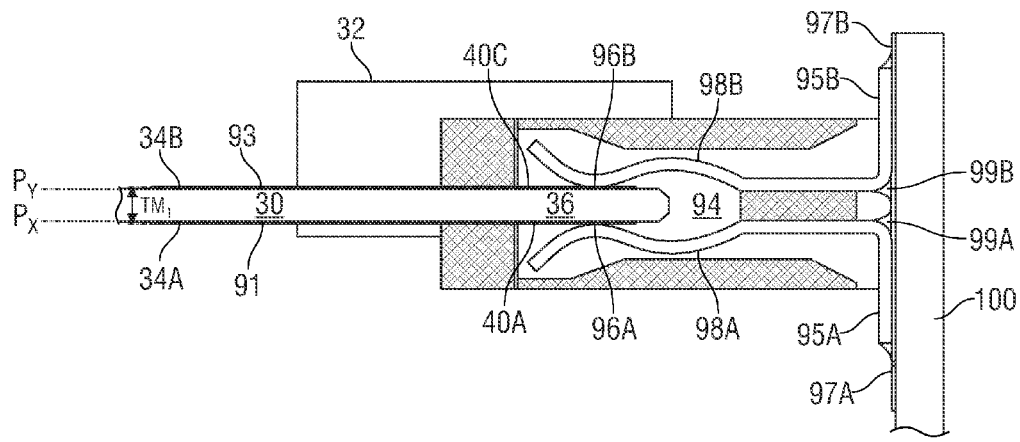
FIG. 14 is an enlarged cross-sectional depiction of the connective mating of an exemplar circuit module with a conventional SFF 8639 specification compliant receptacle in accordance with a preferred embodiment of the present invention.

A circuit diagram model of module 50 is shown in FIG. 13 which in conjunction with FIG. 14 illustrates selected features that contribute to the improved impedance characteristics such as lower impedance and fewer opportunities for reflections arising in selected embodiments of module 50 in accordance with the invention. FIG. 14 is an enlarged cross-sectional depiction of the conductive mating of tab 36 of an exemplar module 50 with a SFF 8639 specification compliant receptacle such as that depicted earlier herein as receptacle 11. Note that this FIG. 14 shows planes $P_X$ and $P_Y$ that correspond to the first and second sides 34A and 34B, respectively, which are shared by tab 36 and PCB 30. Conductive pads 40A and 40C respectively reside on planes $P_X$ and $P_Y$. Plane $P_Z$ established by key adjunct 48 and along which conductive pads 40B reside is not shown in this view. As shown, tab 36 from module 50 is inserted into opening 94 of receptacle 11. As shown in this embodiment, conductive pad 40A is an extension of etch trace 91 of PCB 30 which etch trace is resident at least in part on the first PCB side 34A along plane $P_X$. Conductive pad 40C is an extension of etch trace 93 of PCB 30 which etch trace is resident at least in part on the second PCB side 34B along plane $P_Y$. Further, in the depicted preferred embodiment, conductive pads 40A and 40C are constructed of the same material and are substantially the same thickness as etch traces 91 and 93, respectively, thus further reducing impedance non-uniformity as conductive pad 40A and etch trace 91 are substantially co-planar and conductive pad 40C and etch trace 93 are substantially co-planar with substantial coplanarity being understood to mean that the difference between the respective planes of the etch traces and the conductive pads is less than the thickness of tab 36. Those of skill will appreciate that there are occasions where etch traces of a PCB are disposed at a plane just below their nearest respective surface 34A or 34B of PCB 30 such as when a coating is applied to the PCB. In such cases, such etch traces may still, in some embodiments, be connected to conductive pads of the respective sides of the tab 32 and the etch plane of such etch traces will be substantially co-planar with the plane of the conductive pads of tab 32 to which such etch traces are connected. Those of skill will also appreciate that the term etch trace can apply to a variety of structures that are used to connect various portions and circuitry of circuitry mounted on a PCB and such connective structures which function in the role of the described etch traces in the same manner as do the aforementioned etch traces with the same result should, for purposes of this disclosure be considered commensurate with said etch traces.

As tab 36 of module 50 is inserted into receptacle 11, conductive pad 40A makes contact with contact region 96A of connector element 98A which extends into a surface mount (SMT) lead 95A connected with solder 99A to SMT pad 97A on host PCB 100. Conductive pad 40C makes contact with contact region 96B of connector element 98B which extends into a surface mount lead 95B connected with solder 99B to SMT pad 97B on host PCB 100.

FIG. 13 depicts a model circuit diagram as to the connection from etch trace 91A and conductive pad 40A while those of skill will understand that the principles disclosed in FIG. 13 are applicable to modeling connection between exemplar conductive pads 40C and corresponding etch traces 91B. The model circuit diagram, in contrast to the circuit diagram applicable to the conventional connection between a SFF 8639 plug and connector shown earlier, is reduced to a segment for etch trace 91 with a resistive (Retch), Inductive (Letch) conductance (Getch) and Capactive (Cetch) component and a segment for conductive pad 40A with a resistive (Rcon), Inductive (Lcon) conductance (Gcon) and Capactive (Ccon) component.

Figure 15:
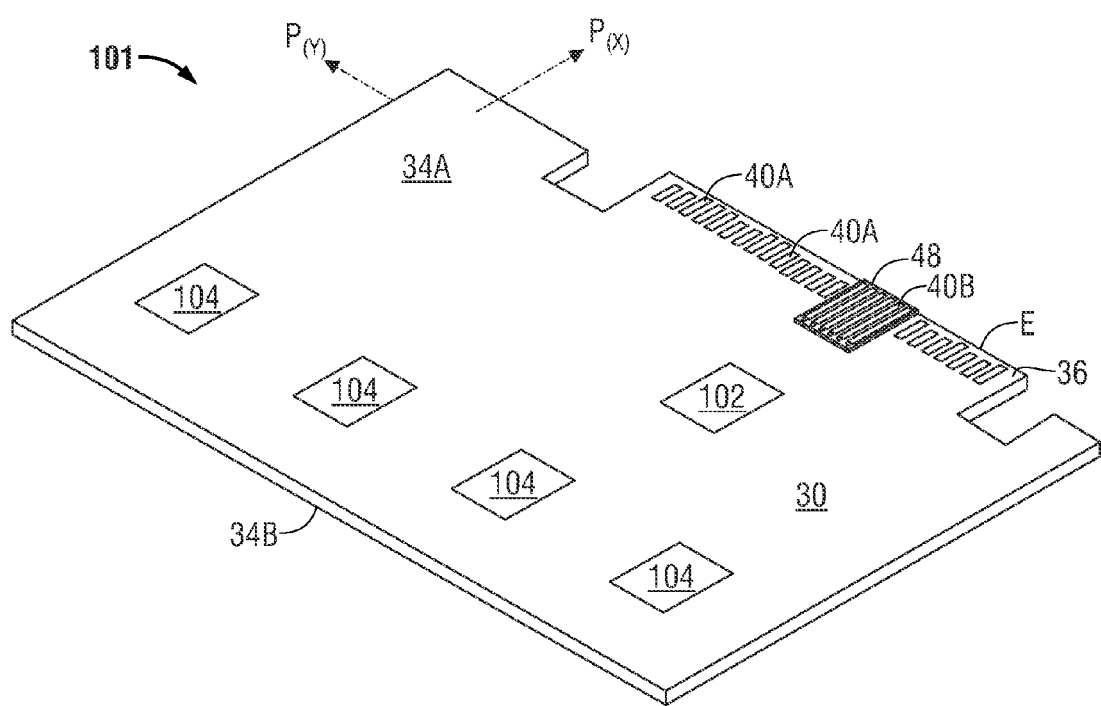
FIG. 15 depicts a sub-component from which an exemplar circuit module in accordance with the invention may be comprised.

FIG. 15 depicts sub-module 101 from which an exemplar module 50 in accordance with the invention may be comprised. Sub-module 101 includes PCB 30 having first side 34A and second side 34B. Tab 36 reaches to edge E of PCB 30. Tab 36 may be formed by routing or punch fabrication or any of a variety of methods and modes of handling and configuring PCBs known in the industry. Being formed of PCB 30, tab 36 shares a first side 34A of PCB 30 that creates plane $P_X$ and second side 34B that creates plane $P_Y$ and has key adjunct 48 that creates plane $P_Z$ as more clearly shown in for example, FIG. 5B. Tab 36 has thicknesses TM1 and TM2 as shown earlier in FIG. 5B. In embodiments that are PCIe compliant, a third set of conductive pads 40C which has been previously disclosed herein is supported by key adjunct 48 although those of skill will recognize that the described invention may be employed to create circuit modules that are specification compliant with other specifications that employ, for example, contacts arrayed along two planes or one plane rather than three. First side 34A of tab 36 supports conductive pads 40A while second side 34B supports conductive pads 40B as shown in earlier Figs of this disclosure. Key adjunct 48 supports conductive pads 40C as shown here. An exemplar module 50 is comprised from a sub-module 101 populated by circuitry that typically performs data storage functions although those of skill will recognize that a variety of functionalities may be implemented on circuitry that populates a module 50 in compliance with the present invention.

In the exemplar sub-module 101 shown in FIG. 15, major components of a solid state disk (SSD) implementation are shown. Controller 102 is a typical SSD controller. A variety of controllers may be chosen as a controller for an SSD implementation as those of skill recognize. Many such controllers exist and may be used in SSD implementations realized in exemplar module 50 in accord with the present invention. One exemplar offered merely as an example which should in no way be deemed limiting, is a SendForce 2582 SSD controller. Being a storage device, an SSD requires storage circuitry typically in the form of flash memory. There are many design choices of storage just as there are many design choices as to controllers. Circuitry 104 depicts flash memory employed in the exemplar SSD circuitry populated on sub-module 101 as depicted in FIG. 15.

As those of skill will appreciate, module 50 may be employed without placing PCB 30 in a case or, if module 50 is to be deployed in an environment external to a system, a case is often preferred. In such scenarios, module 50 will include a case and that case, in accordance with an embodiment of the invention, may be configured to present the features needed to mate with a standards compliant receptacle.

Figure 16A:
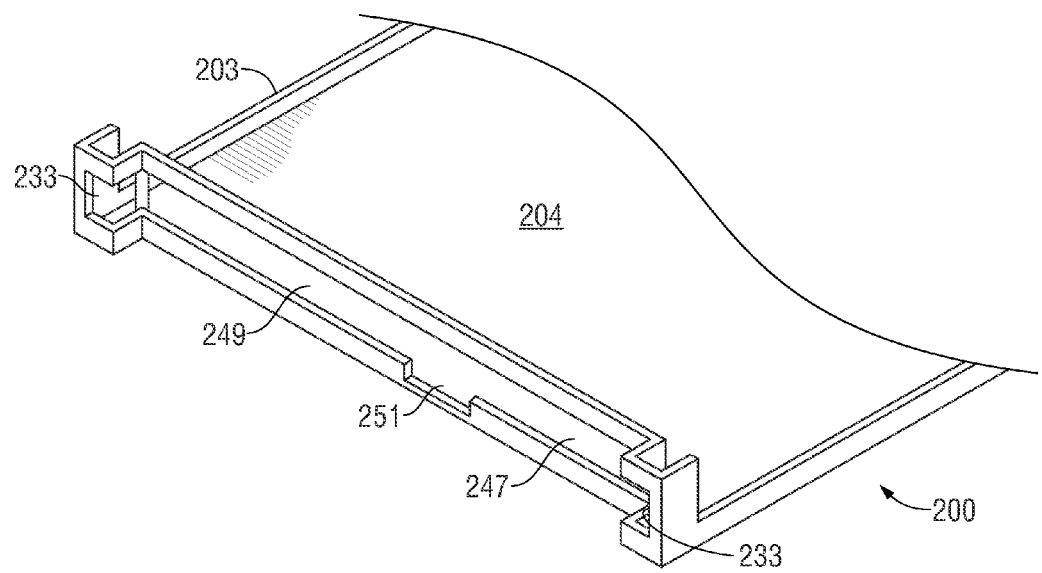
FIG. 16A depicts a lower portion of a case for an exemplar module in accordance with an embodiment of the present invention.

For example, FIG. 16A is a depiction of an embodiment of a lower portion 203 of a case 200 that is configured with a slot profile 247 from which tab 36 of PCB 30 may be emergent to present a module 50 embodiment in which the circuit populated PCB 30 is protected from an external environment by case 200. Floor 204 of lower portion 203 of case 202 is shown.

Case 200 is configured to mate with a specification compliant receptacle such as receptacle 11 depicted in earlier FIGS. 3A and 3B, for example. Slot profile 247 is configured to provide a slot 249 for the wide aspect of tab 36 of PCB 30 and the slot profile 247 of case 202 may or may not exhibit key adjunct slot 251 which is shown in this view of an embodiment. Guide post slots 233 are configured to accept guides 15 of a standards compliant receptacle such as, for example, receptacle 11 earlier shown. Although shown as rectangular in configuration, those of skill will appreciate that the guide post slots 233 will comport in shape with the guide posts of the receptive receptacle with which they mechanically mate and therefore, they may take on polygonal aspects of a variety of configurations. As will be appreciated, an embodiment of module 50 configured with case 202 mates with a specification compliant receptacle and with tab 36 emergent from slot profile 247 as shown in FIG. 16B, the embodiment is configured to connectively mate with a standards compliant receptacle.

Case 202 may be comprised of any type of configurable material such as any of a variety of plastics or carbon based materials and, in those rare instances where electromagnetic hardness is required, other materials that may be conductive of electromagnetic energy to a ground but those of skill will appreciate no limitations are imposed on case 202 materials other than configurability to provide structural features that provide mating capability with receptacles.

Figure 16B:
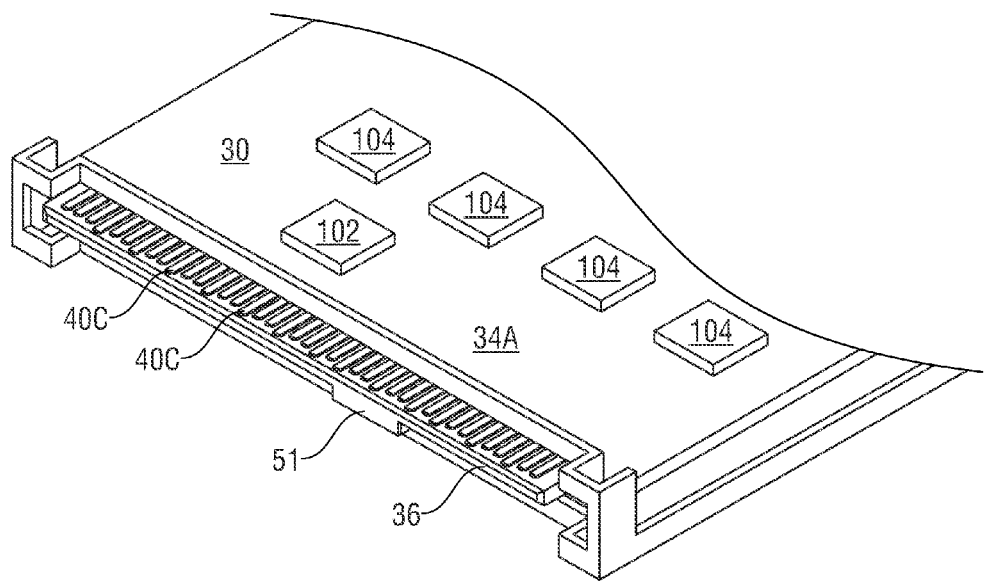
FIG. 16B depicts a lower portion of an exemplar case for an exemplar module in accordance with an embodiment of the present invention in which a PCB populated with storage circuitry is disposed within a case and a tab of the PCB emerges from a slot along one side of the module case.

FIG. 16B depicts an embodiment of a module 50 in which tab 36 emerges from slot 247 and PCB 30 is set into lower section 203 of case 202. PCB 30 is shown populated as a prototypical SSD circuit with controller 102 and storage ICs 104 which typically are flash memory in embodiments which are configured as SSDs.

As shown, tab 36 in the depicted embodiment includes key adjunt 51 that emerges from key adjunct slot 251 portion of slot profile 247. Conductive pads 40C are shown along tab 36 and, as earlier shown in FIG. 14, in a preferred embodiment conductive pads 40C are along plane Py. As those of skill will appreciate, in configurations adapted for specification compliance not comporting with the SFF 8639 Specification, key adjunct 51 may or may not be present as part of tab 36. In other instances, key adjunct 51 may be present but not populated with conductive pads 40B.

Figure 17:
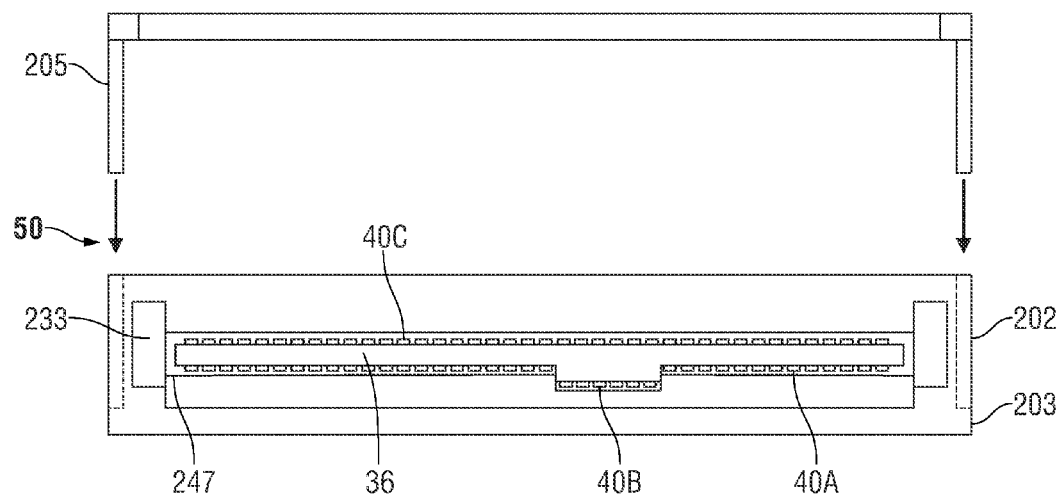
FIG. 17 is a frontal aspect view showing an exploded aspect of a lower and upper portion of a case in accordance with an embodiment of the present invention.

FIG. 17 depicts a frontal aspect view of an exploded perspective of an embodiment of an exemplar module 50 that employs a case 202 with its upper portion 205 shown. As depicted, tab 36 of PCB 30 is emergent from slot profile 247 of lower case portion 203. Conductive pads 40A, 40B and 40C are shown as are guide post slots 233.

Figure 18:
FIG. 18 depicts an exemplar module in accordance with an embodiment that employs a case to contain a PCB populated with circuitry and from which case, a tab of the PCB emerges.

FIG. 18 is a top down aspect view of lower case portion 203 within which is set circuitry populated PCB 30. As shown, tab 36 emerges from slot profile 247 to provide connective mating with a specification compliant receptacle.

Figure 19:
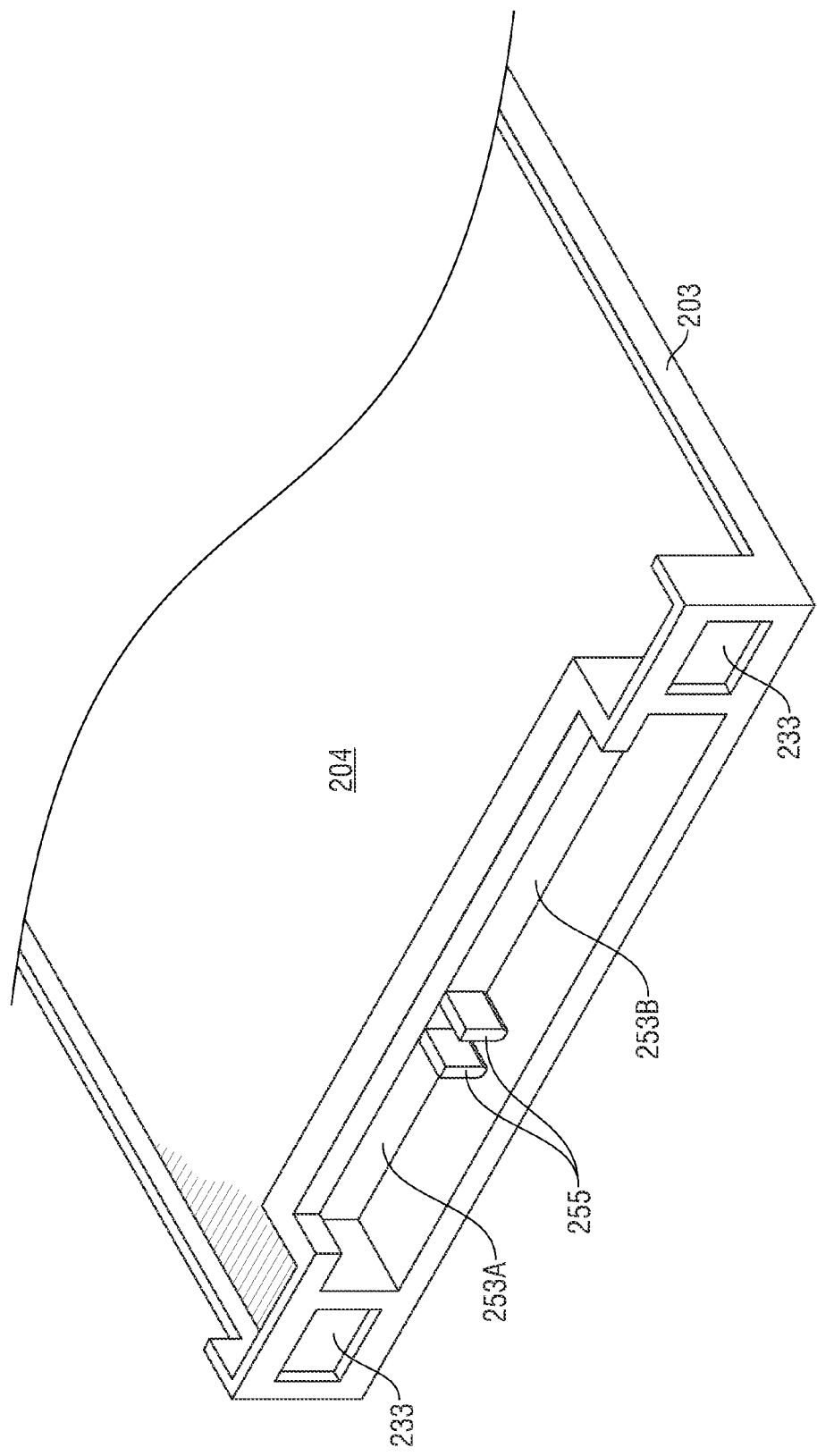
FIG. 19 depicts a top down aspect view of a lower portion of a case which provides a frontal configuration compliant with the requirements for mechanically mating with a SATA compliant socket.

FIG. 19 shows a top down aspect view of a lower case 203 portion of case 200 configured for mechanical mating with an SATA standards compliant receptacle. Keys 255 and guide slots 233 provide mechanical mating features in case 200 which features may be configured in lower portion 203 or along the facial front of an upper portion the choice being one of design integration with the overall case for module 50. Further information concerning SATA is found in U.S. Pat. No. 8,951,070 (application Ser. No. 14/053,028) which has been incorporated by reference herein.

Figure 20:
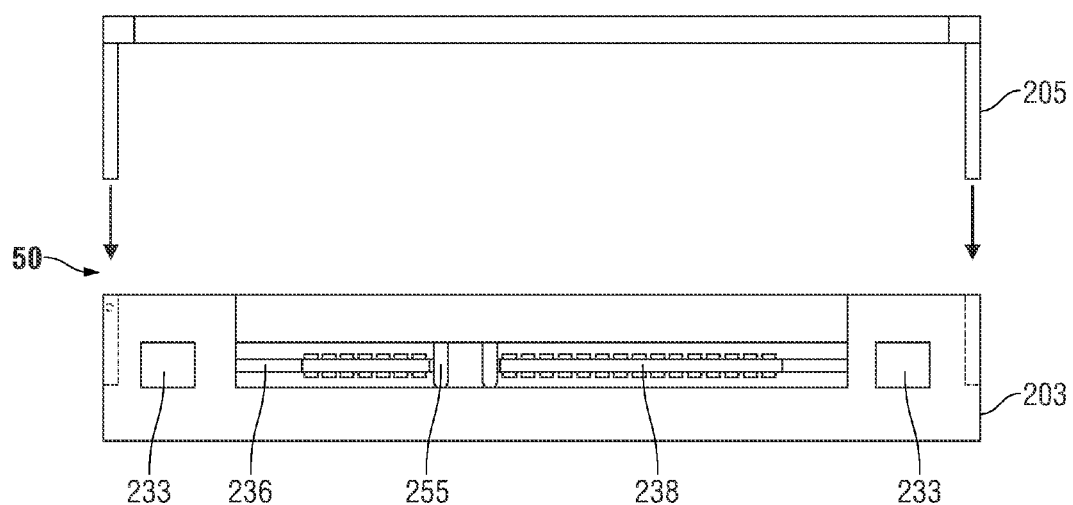
FIG. 20 depicts an exploded frontal view of a circuit module in accordance with an embodiment of the present invention.

FIG. 20 depicts an exploded frontal view of an exemplar module 50 connectively compliant with an SATA receptacle and in which mechanical connective features are integrated with case 200. Guide post slots 233 are shown as are keys 255 and as is known by those of skill, in SATA modules, there are two blades and therefore in this embodiment of the present invention there are two tabs 236 and 238 which are extensions of PCB 30 and are substantially dimensionally compliant with the SATA requirements for the respective blades of a standard SATA plug connector.

FIG. 21 depicts a perspective view of a lower portion of a case configured for mechanical mating with a SATA standards compliant receptacle and within which case a circuitry populated PCB is disposed and from which case emerge two tabs from two respective slots.

The PCIe interface is used by many storage devices and the principles of the invention may be employed to create a module 50 that is compliant with the PCIe interface as well as the SFF 8639 specification or other standards specifications or, for example, the SAS interface in a SFF 8639 specification compliant connective strategy. As has been shown, the principles of the present invention may also be employed to provide modules that employ cases which are configured for mechanical mating with a variety of standard receptacles including just as examples those that are compliant with the SFF 8639 specification or the SATA specifications. The present invention provides a circuit module and connective structures that exhibit superior electrical performance and lower cost than those created by attaching a conventional plug connector to a circuit populated PCB. One skilled in the art will recognize that embodiments and principles of the present invention may be used in other standards compliant connector embodiments or in other connectors that specify contact and blade configurations.

The present invention can be used advantageously to increase the speed and reliability while reducing the footprint on the module of the plug connector in storage and other circuitry subsystems of portable consumer electronics or computing systems.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments described in the specification. As one of ordinary skill in the art will readily appreciate from the disclosure of the present invention, the structures, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, structures, machines, manufacture, compositions of matter, means, methods, or steps.

We claim:

1. A circuit module configured for connective mating with a compliant receptacle, the circuit module comprising:
    a printed circuit board (PCB) with an extended tab connector base having a tab thickness that substantially corresponds to a predetermined blade connector thickness and a width that substantially corresponds to a predetermined blade connector width, said extended tab connector base extends outwardly from one edge of the printed circuit board (PCB) by a first extension length and said printed circuit board (PCB) having a first and a second notch in the planar profile of the printed circuit board (PCB) with said first and said second notches being located respectively on either side of the extended tab connector base and a first plurality of conductive pads disposed along a first conductive pad plane on a top surface of the extended tab connector base and a second plurality of conductive pads disposed along a second conductive pad plane on a bottom surface of the extended tab connector base;
    a first plurality of etch traces being disposed on a first etch trace plane and being integrally formed into individual ones of the first plurality of conductive pads, to reduce the resistance of the connector assembly, the first conductive pad plane and the first etch trace plane being substantially coplanar;
    a connector housing that surrounds the extended tab connector base, said connector housing having a plurality of lateral lengths extending along the top surface and the bottom surface, respectively, of said first and said second conductive planes of said extended tab connector base, a first and second guide arm that extends outwardly from the printed circuit board (PCB) on both ends of said lateral lengths, a first and second side card guide that extends toward the printed circuit board (PCB) on both ends of said lateral lengths, with each of said side card guides being designed to fit in one of said notches located on each side of the width of the extended tab connector base, and an elongated slot defined between said lateral lengths, said guide arms and said side card guides of said housing, said elongated slot allowing the extended tab connector base to extend outwardly through the housing for connection of connection pads with a compliant receptacle; and,
    said guide arms forming one or more receptacle guide arm slots configured for reception of receptacle guide arms of a compliant receptacle to engage the conductive pads on the extended tab connector base.

2. The circuit module of claim 1 wherein, the printed circuit board (PCB) a second plurality of etch traces, being integrally formed with said second plurality of conductive pads to reduce the resistance of the connector assembly, the second conductive pad plane and the second etch trace plane being substantially coplanar.

3. The circuit module of claim 2 in which the first conductive pad plane is an extension of a first major surface of the printed circuit board (PCB) and the second conductive pad plane is an extension of a second major surface of the printed circuit board (PCB).

4. The circuit module of claim 2 in which the extended tab connector base tab meets dimensional requirements for a blade as specified in the SFF 8639 Specification.

5. The circuit module of claim 4 in which the extended tab connector base has a tab width and the tab width is compliant with a width specified in the SFF 8639 Specification for the 8639 blade.

6. The circuit module of claim 4 in which the extended tab connector base thickness is compliant with a thickness specified in the SFF 8639 Specification for the 8639 blade.

7. The circuit module of claim 6 in which the first conductive pad plane is an extension of the top surface of the printed circuit board (PCB) and the second conductive pad plane is an extension of the bottom surface of the printed circuit board (PCB).

8. The circuit module of claim 2 in which the extended tab connector base further comprises a key adjunct having a plurality of raised key conductive pads, the plurality of key adjunct conductive pads being arranged to meet dimensional requirements of the SFF 8639 Specification for a key set of contacts on a 8639 blade.

9. The circuit module of claim 8 in which the circuit module is compliant with the PCIe protocol standard.

10. The circuit module of claim 8 in which the circuit module is an SSD.

11. The circuit module of claim 2 in which the circuit module is an SSD.

12. The circuit module of claim 1 in which the extended tab connector base meets dimensional requirements for a 8639 blade as specified in the SFF 8639 Specification.

13. The circuit module of claim 12 in which the extended tab connector base has a tab width that is compliant with a width specified in the SFF 8639 Specification for the 8639 blade.

14. The circuit module of claim 12 in which the extended tab connector base thickness is compliant with a thickness specified in the SFF 8639 Specification for the 8639 blade.

15. The circuit module of claim 1 in which the first conductive pad plane is an extension of a first major surface of the printed circuit board (PCB).

16. A circuit module configured for connective mating with a compliant receptacle, the circuit module comprising:
- a printed circuit board (PCB) having an extended tab connector base with a tab thickness that substantially corresponds to a predetermined blade connector thickness and a width that substantially corresponds to a predetermined blade connector width, said extended tab extends outwardly from one edge of the printed circuit board (PCB) by a first extension length and a first plurality of conductive pads disposed along a first conductive pad plane on a first side of the extended tab connector base tab and a second plurality of conductive pad disposed along a second conductive pad plane on a second side of the extended tab connector base;
- a first plurality of etch traces being disposed on a first side of the printed circuit board (PCB) being integrally formed into individual ones of the first plurality of conductive pads to reduce the resistance of the connector assembly, the first conductive pad plane and the first side of the printed circuit board (PCB) being substantially coplanar;
- a second plurality of etch traces being disposed on a second side of the printed circuit board (PCB) and being integrally formed into individual ones of the second plurality of conductive pads to reduce the resistance of the connector assembly, the second conductive pad plane and the second side of the printed circuit board (PCB) being substantially coplanar;
- a connector housing that surrounds the extended tab connector base, said connector housing having first and second guide arms that extend outwardly from the printed circuit board (PCB) on both ends of said lateral lengths, that allows the extended tab connector base to extend outwardly through the connector housing for connection of connection pads with a compliant receptacle; and, said guide arms forming one or more guide arm slots for mechanical mating with a compliant receptacle to assist with the engagement of the first or second conductive pads located on the extended tab connector base to a compliant receptacle.

17. The circuit module of claim 16 in which the tab includes a key adjunct along which is disposed a third plurality of conductive pads connected to circuitry populated upon the printed circuit board (PCB).

18. The circuit module of claim 17 in which the key adjunct meets dimensional requirements of the SFF-8639 Specification for a key of the 8639 blade.

19. The circuit module of claim 17 in which the circuit module is an SSD.

20. The circuit module of claim 16 in which the circuit module is an SSD.

21. A circuit module configured for connective mating with a compliant socket, the circuit module comprising:
- a printed circuit board (PCB) having a first printed circuit board (PCB) side establishing plane Px and a second printed circuit board (PCB) side that establishes plane Py;
- the printed circuit board (PCB) being configured with an extended tab connector base that shares the first printed circuit board (PCB) side and the second printed circuit board (PCB), the extended tab connector base being configured to be compliant with dimensional requirements for a blade connector, the extended tab connector base having a thickness that substantially corresponds to a predetermined blade connector thickness and a width that substantially corresponds to a predetermined blade connector width, said extended tab extends outwardly from one edge of the printed circuit board (PCB) by a first extension length and said printed circuit board (PCB) having a first and a second notch in the planar profile of the printed circuit board (PCB) with said first and said second notches being located respectively on either side of the extended tab connector base;
- a first set of conductive pads on the first printed circuit board (PCB) and a second set of conductive pads on said second printed circuit board (PCB) side;
- a tab key adjunct emergent from and raised above the first printed circuit board (PCB) side, the tab key adjunct being configured to be compliant with dimensional requirements for a key and having a third set of conductive pads, each of the first, second, and third sets of conductive pads being compliant with dimensional requirements for contacts of the blade on the extended tab connector base;
- each of the constituent conductive pads of the first set of conductive pads being integrally connected with one or more respective first side etch traces on the first printed circuit board (PCB) side so that the one or more respective first side etch traces and the constituent conductive pads of the first set of conductive pads are substantially coincident with the plane Px;
- a connector housing that surrounds the extended tab connector base, said connector housing having a plurality of lateral lengths extending along the first side of the printed circuit board PCB and the second side of the printed circuit board (PCB), respectively, of said extended tab connector base that extends from the side of the printed circuit board (PCB), a first and second guide arm that extends outwardly from the printed circuit board (PCB) on both ends of said lateral lengths, a first and second side card guide that extends toward the printed circuit board (PCB) on both ends of said lateral lengths, with each of said side card guide being designed to fit in one of said notches located on each side of the width of the extended tab connector base, and an elongated slot defined between said lateral lengths, said guide arms and said side card guides of said housing, said elongated slot allowing the extended tab connector base to extend outwardly through the housing for connection of connection pads with a compliant receptacle; and,
- the guide arms defining one or more guide arm slots for mechanical mating with a receptacle for engagement with said first, second or third sets of conductive pads emerging from said slot housing and residing on the extended tab connector base.

22. The circuit module of claim 21 wherein the third set of conductive pads integrally connected to one or more etch traces on the second printed circuit board (PCB) side so that the one or more second side respective etch traces and the constituent conductive pads of the second set of conductive pads are substantially coincident with the plane Py.

23. The circuit module of claim 22 wherein the dimensional requirements for the blade are as specified in the SFF 8639 Specification with which the extended tab connector base is configured for compliance include a width for the 8639 blade.

24. The circuit module of claim 23 wherein the first set of conductive pads are of the same number and substantially the same size and position as specified in the SFF 8639 Specification for a set of contacts for the 8639 blade.

25. The circuit module of claim 23 wherein the third set of conductive pads being of the same number and substantially the same size and position as specified in the SFF 8639 Specification for a third set of contacts for the 8639 blade.

26. The circuit module of claim 23 wherein the second set of conductive pads being of the same number and substantially the same size and position as specified in the SFF 8639 Specification for a second set of contacts associated with a key of the 8639 blade.

27. The circuit module of claim 23 wherein the circuit module is an SSD.

28. The circuit module of claim 23 wherein the circuit module is an SSD complaint with a PCIe signaling protocol.

29. A circuit module configured for connective mating with a SFF-8639 compliant receptacle, the circuit module comprising:
- a printed circuit board (PCB) having a extended tab connector base with a tab thickness and a first plurality of conductive pads disposed along a first conductive pad plane on a first side of the extended tab connector base, the extended tab connector base being compliant with dimensional requirements for a predetermined sized blade;
- the printed circuit board (PCB) having a first plurality of etch traces, the first plurality of etch traces being disposed on a first side of the printed circuit board (PCB), at a first printed circuit board (PCB) side plane and individual ones of the first plurality of etch traces being integrally connected to individual ones of the first plurality of conductive pads, the first conductive pad plane and the first printed circuit board (PCB) side plane being substantially coplanar;
- a second plurality of conductive pads being disposed along a second conductive pad plane on a second side of the extended tab connector base, the printed circuit board (PCB) further having a second plurality of etch traces, being integrally disposed with individual ones of a extended second plurality of etch traces, the second conductive pad plane and the printed circuit board (PCB) side plane be integrated with the printed circuit board (PCB); and
- a connector housing configured for connective fit with a compliant receptacle, the connector housing having a front portion and a rear portion, the rear portion having a pair of laterally-opposed guide arms with guide slots into which are disposed the first and second lateral tabs of the printed circuit board (PCB), the connector housing having a slot profile from which emerges the tab of the printed circuit board (PCB).

30. The circuit module of claim 29 wherein having a housing within which is disposed a slot from which emerges the extended tab connector base of the printed circuit board (PCB), the printed circuit board (PCB) being populated with data storage circuitry, the housing being configured with guide arm slots configured for reception of guide arms of a compliant receptacle.

31. A circuit module configured for mating with a compliant storage socket, the circuit module comprising:
- a printed circuit board (PCB) with a first printed circuit board (PCB) surface and a second printed circuit board (PCB) surface; the printed circuit board (PCB) having a thickness substantially corresponding to a predetermined thickness dimension for a plug connector blade; the printed circuit board (PCB) configured with a first extended tab connector and a second extended tab connector, a first lateral tab connector, and a second lateral tab connector;
- the first extended tab connector formed to be substantially the size and shape for a predetermined signal blade;
  - the extended second connector tab formed to be substantially the size and shape for a predetermined power blade;
- the first extended tab connector having electrical contacts disposed on the first printed circuit board (PCB) surface and being integrally connected to one or more respective etch traces located on the first printed circuit board (PCB) surface of the printed circuit board (PCB) so that the one or more etch traces and electrical contacts are substantially coincident along the plane defined by the first printed circuit board (PCB) surface;
- the second extended tab connector having electrical contacts disposed on the first printed circuit board (PCB) surface;
- the first extended tab connector and second extended tab connector being positioned apart substantially on a signal blade and power blade respectively;
- a module case having a first slot and a second slot through which emerge, respectively, the first extended tab connector and second extended tab connector of the printed circuit board (PCB), the module case having two keys proximally disposed adjacent to the first and second slots of the module case wherein said keys are compliant for being coupled to a receptacle for said keys; the module case further having a pair of laterally-opposed guide arm receiving cavities being integrally formed with the module case and being disposed in line with the first tab and the second tab, the module case being adapted for mating with a receptacle connector.

\* \* \* \* \*

UNITED STATES PATENT AND TRADEMARK OFFICE
CERTIFICATE OF CORRECTION

PATENT NO. : 9,301,415 B2
APPLICATION NO. : 14/626515
DATED : March 29, 2016
INVENTOR(S) : Paul Goodwin et al.

It is certified that error appears in the above-identified patent and that said Letters Patent is hereby corrected as shown below:

In the Claims

Claim 16, line 12 (Col. 15, ln. 15), replace "conductive pad disposed" with --conductive pads disposed--
Claim 23, line 4 (Col. 16, ln. 62), replace "include" with --including--
Claim 28, line 2 (Col. 17, ln. 14), replace "complaint" with --compliant--
Claim 29, line 4 (Col. 17, ln. 18), replace "a" with --an-- (2nd occurrence)
Claim 29, line 13 (Col. 17, ln. 26), delete "," after (PCB)
Claim 29, line 24 (Col. 17, ln. 37), replace "a" with --an--
Claim 29, line 27 (Col. 17, ln. 40), replace "be" with --being--

Signed and Sealed this
Twenty-first Day of June, 2016

Michelle K. Lee
*Director of the United States Patent and Trademark Office*